United States Patent [19]
Olmstead

[11] Patent Number: 5,196,737
[45] Date of Patent: Mar. 23, 1993

[54] LATCHING COMPARATOR EMPLOYING TRANSFER GATES

[75] Inventor: John A. Olmstead, Cape May Court House, N.J.

[73] Assignee: Harris Corporation, Melbourne, Fla.

[21] Appl. No.: 682,482

[22] Filed: Apr. 9, 1991

[51] Int. Cl.⁵ .................... H03K 3/26; H03K 3/284
[52] U.S. Cl. .................... 307/279; 307/272.1; 307/571; 307/355; 307/356
[58] Field of Search .............. 307/448, 451, 272.1, 307/279, 571, 353, 355–356, 530

[56] References Cited

U.S. PATENT DOCUMENTS

| | | | |
|---|---|---|---|
| 4,511,810 | 4/1985 | Yukawa | 307/355 |
| 4,716,312 | 12/1987 | Mead et al. | 307/279 |
| 4,939,384 | 7/1990 | Shikata et al. | 307/272.1 |
| 4,985,905 | 1/1991 | Kubinec | 307/279 |

Primary Examiner—William L. Sikes
Assistant Examiner—Margaret Rose Wambach
Attorney, Agent, or Firm—Charles C. Krawczyk; Ferdinand M. Romano; Brian S. Steinberger

[57] ABSTRACT

First and second outputs of a differential amplifier stage are coupled via first and second selectively enabled transmission gates to first and second inputs of a selectively enabled complementary flip-flop. During a data sensing and acquisition phase, the transmission gates are enabled and the flip-flop is disabled. Although the flip-flop is disabled, two of its cross coupled transistors are coupled via the transmission gates to the differential amplifier stage. This enhances the setting of the flip-flop when it is subsequently enabled and the transmission gates are disabled.

10 Claims, 3 Drawing Sheets

LATCHING COMPARATOR EMPLOYING TRANSFER GATES

BACKGROUND OF THE INVENTION

This invention relates to comparator circuitry, and in particular, to comparator circuitry for sensing and storing signals representative of input signals.

It is known to sense and compare input signals using differential amplifiers and to produce amplified signals at the output of the differential amplifiers. It is also known to couple the amplified output to a latch or flip-flop circuit to store the amplified differential signals. By way of example, refer to FIG. 1 which shows a prior art circuit described in FIG. 13 of an article titled, "A 10 bit 15 MHZ CMOS Recycling Two-Step A/D Converter", authored by Bang-Sup Song et. al. and published in the IEEE Journal of Solid State Circuits Vol. 25, No. Dec. 6, 1990. The prior art circuit of FIG. 1, includes an amplifier comprised of transistors M1, M2, M3, M4, and M11. The outputs of the amplifier are coupled via transistors M5 and M6 to a latching circuit comprised of transistors M7, M8, and M12 which is selectively reset to a neutral state by means of shunting circuitry comprised of transistors M9, M10 and M13. When signals to be compared are applied to the inputs of M1 and M2 (i.e., during a data acquisition phase), the amplified signals are translated via M5 and M6 into nodes Q and Q(not). Concurrently, M9 and M10, whose conduction paths are returned to ground via M13, shunt the latch keeping Q and Q(not) at a low level which also maintains the latch at a low gain level and in a non-regenerative state. When the data acquisition phase ends and the data storage (or latching) phase begins, M9 and M10 are turned-off while Q and Q(not) are still being precharged by the amplifier. As M9 and M10 are being turned-off, the latch is set to the condition reflective of the value of Q and Q(not).

A problem with the prior art circuit is that the latch will draw current in the steady state even when it has reached its fully latched condition because one of M5 and M6 will be trying to force current into a node that is held "low" by M7 or M8. Another problem with the prior art circuit is that, at the onset of the latching phase, the amount of regeneration and thus, its speed, is limited to that supplied by the "one sided latch" made up of M7 and M8. Furthermore, the circuit is susceptible to switching noise when the shunting transistors are turned off which may mask the signal being coupled into the latch.

The problems discussed above are either eliminated or significantly reduced in circuits embodying the invention.

SUMMARY OF THE INVENTION

In circuits embodying the invention, the outputs of a differential amplifier are coupled via selectively enabled transmission gates to inputs of a selectively powered flip-flop. During a data acquisition phase, the transmission gates are enabled coupling the amplifier outputs to inputs of the flip-flop and precharging parts of the flip-flop, even though the flip-flop is not enabled during the data acquisition phase. During a subsequent data storage phase, the transmission gates are disabled decoupling the amplifier from the flip-flop which is enabled and stores data corresponding to the amplifier outputs produced during the preceding data acquisition phase. In a preferred embodiment the flip-flop is a "complementary" flip-flop which draws no current in the steady state condition.

DETAILED DESCRIPTION OF THE INVENTION

Figure 1:
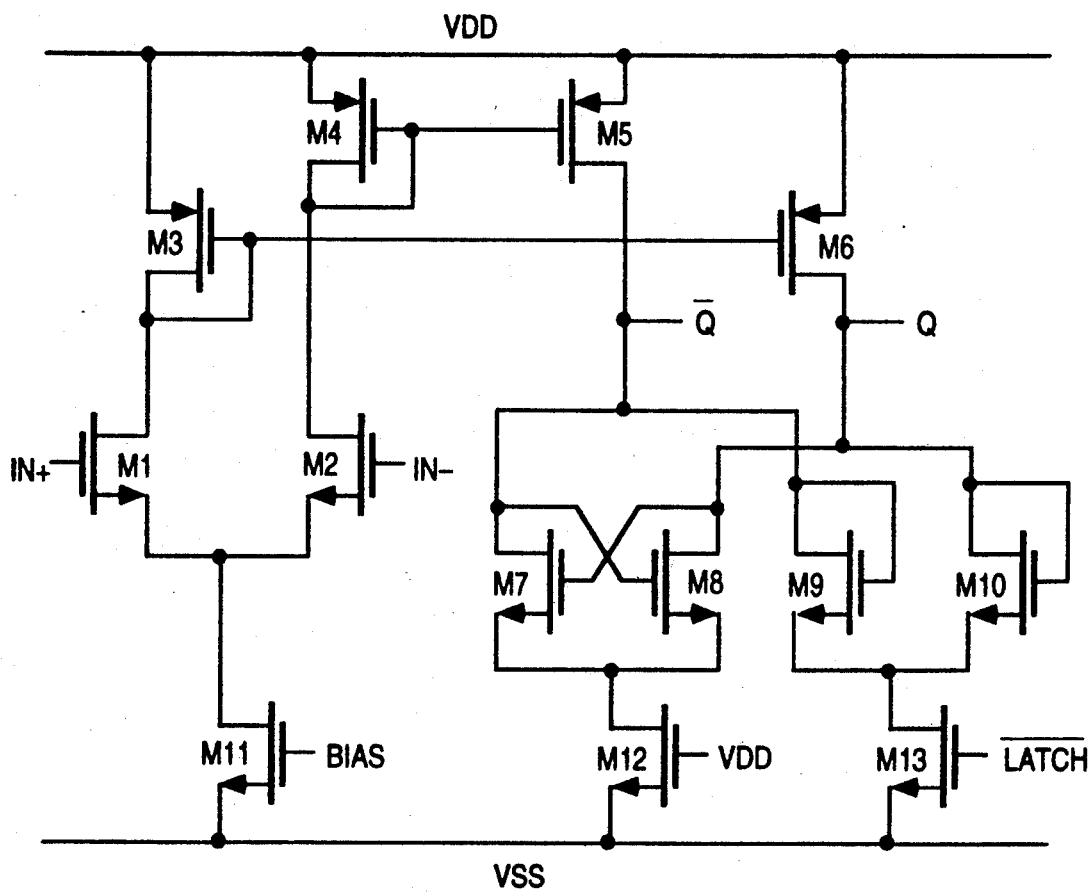
FIG. 1 is a schematic diagram of a prior art latching comparator circuit.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor" when used without limitation in the appended claims, is used in a generic sense.

In the FIGURES, enhancement type IGFETs of P conductivity type are identified by the letter P folowed by a particular reference character; and enhancement type IGFETs of N-conductivity type are identified by the letter N folowed by a particular reference character. The characteristics of IGFETs are well known and need not be described in detail. But, for a clearer understanding of the description to follow, definition and characteristics of IGFETs pertinent to the invention are set forth below.

1. IGFETs have a first electrode and a second electrode referred to as the source and drain defining the ends of a conduction path, and a control electrode (gate) whose applied potential determines the conductivity of the conduction path. For a P-type IGFET the source electrode is defined as that electrode of the first and second elctrodes having the highest potential applied thereto. For an N-type IGFET, the source electrode is defined as that electrode of the first and second electrodes having the lowest potential applied thereto.

2. The devices used are bidirectional in the sense that when an enabling signal is applied to the control electrode, current can flow in either direction in the conduction path defined by the first and second electrodes.

3. For conduction to occur, the applied gate-to-source potential (Vgs) must be in a direction to forward bias the gate with respect to the source and must be greater in magnitude than a given value which is defined as the threshold voltage (Vt). Thus, where the applied Vgs is in a direction to forward bias the transistor but is lower in amplitude than Vt the transistor remains cut off and there is substantially no current flow in the conduction channel.

4. When used as a source follower, the voltage at the source electrode (Vs) "follows" the signal applied at the gate (Vg) but is offset with respect to the gate by a voltage whose amplitude is approximately equal to the threshold voltage (Vt) of the device (Vs ~Vg−Vt).

Figure 2:
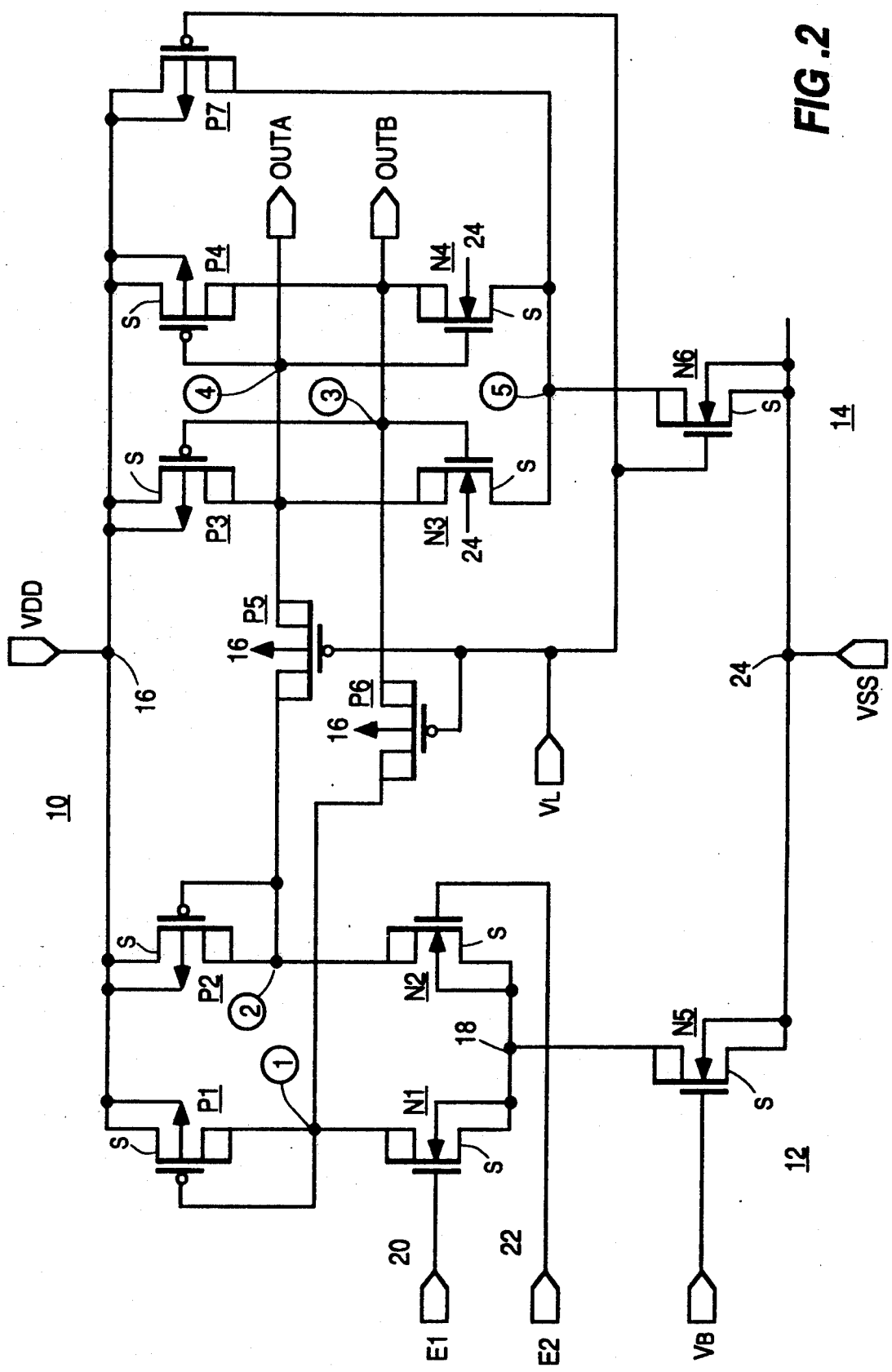
FIG. 2 is a schematic diagram of a circuit embodying the invention.

Referring to FIG. 2, there is shown a latching comparator circuit 10 which includes an input differential amplifier stage 12 having differential outputs 01 and 02 which are respectively coupled via gating transistors P6 and P5 to a selectively powered flip-flop 14.

The differential stage 12 includes load transistors P1, P2, differentially connected amplifying transistors N1, N2 and a current source transistor N5. The conduction paths of P1 and P2 are respectively connected between a power supply line 16 and the first (O1) and the second (O2) output terminals of the amplifier stage 12. The gate electrodes of P1 and P2 are connected to the drain electrodes of their respective transistors. The conduction path of N1 is connected between output O1 and a common node 18 and its gate is connected to an input terminal 20 to which is applied input signals, E1, which are to be compared with input (or reference) signals, E2, applied to an input terminal 22. The conduction path of N2 is connected between output O2 and node 18 and its gate electrode is connected to input terminal 22. The conduction path of N5 is connected between node 18 and a power supply line 24. A bias voltage $V_B$ is applied to the gate electrode of N5 to bias it into conduction, whereby it functions as a relatively constant current source and sets the maximum current levels flowing through N1 and N2.

The most positive operating potential denoted as $V_{DD}$ is applied to supply line 16 and the most negative operating potential denoted as $V_{SS}$ is applied to supply line 24. For ease of discussion, VSS is assumed to be ground potential.

The first output O1 is coupled via the conduction path of P6 to node 3 which functions as one of the two signal inputs to the selectively enabled flip-flop (latch) 14. The second output O2 is coupled via the conduction path of P5 to node 4 which forms the other one of the two signal inputs to flip-flop 14.

As described below, latch 14 is a selectively enabled bistable latch using complementary transistors (P3, N3, P4, N4). Latch 14 includes a first branch comprised of P3 and N3 which is cross coupled with a second branch comprised of P4 and N4. The sources of N3 and N4 are coupled to a common node 5. The conduction path of P3 is connected between $V_{DD}$ and node 4 and the conduction path of N3 is connected between nodes 4 and 5. The gate electrodes of N3 and P3 are connected in common to node 3 to which is connected the drains of P4 and N4. The conduction path of P4 is connected between $V_{DD}$ and node 3 and the conduction path of N4 is connected between nodes 3 and 5. The gate electrodes of N4 and P4 are connected in common to node 4 to which are connected the drains of N3 and P3.

The conduction path of N6 is connected between node 5 and ground and the conduction path of P7 is connected between $V_{DD}$ and node 5.

A control voltage $V_L$ is applied to the gates of N6 and P7. When $V_L$ is "low", N6 is turned-off and P7 is turned-on. This applies $V_{DD}$ volts to node 5 which disables latch 14 as further detailed below. When $V_L$ is "high", N6 is turned-on and P7 is turned-off. N6 then provides a path between node 5 and ground and the latch is rendered operable.

The operation of input stage 12 is well known and need not be greatly detailed. Suffice it to say that differentially connected IGFETS N1 and N2 have their source electrodes connected in common to node 18 to which is connected the drain of N5 which functions as a relatively high impedance, relatively constant current sink. P1 and P2 respectively connected to the drains of N1 and N2, function as loads connected between outputs O1 and O2, respectively, and $V_{DD}$.

a) When the input signal E1 applied to the gate of N1 is greater than the input signal E2 applied to the gate of N2, the current through N1 is greater than the current through N2 and the output voltage, V1, at output O1 is less than the output voltage, V2, at output O2. [That is, for E1 greater than E2, V1 decreases relative to ground and V2 increases relative to ground.]

b) When the input signal E1 is less than the input signal E2, the current through N1 is less than the current through N2, causing V1 to be greater than V2. [i.e. V1 increases relative to ground and V2 decreases relative to ground.]

The latching comparator 10 uses two time periods to make and store a comparison. These two time periods correspond to two conditions of the latching voltage VL. One condition occurs when VL is "low" and is at, or close to, ground potential. This condition or phase is referred to herein as the data acquisition phase. During this phase (data acquisition) the transmission gates P6 and P5 are enabled, coupling outputs O1 and O2 to nodes 3 and 4 respectively, while the latch 14 is disabled. Another latch condition occurs when VL is "high" and is at, or close to, VDD volts. This condition is referred to herein as the "latching" or data storage phase. During this phase, the transmission gates P5 and P6 are disabled while the latch 14 is enabled.

Figure 3:
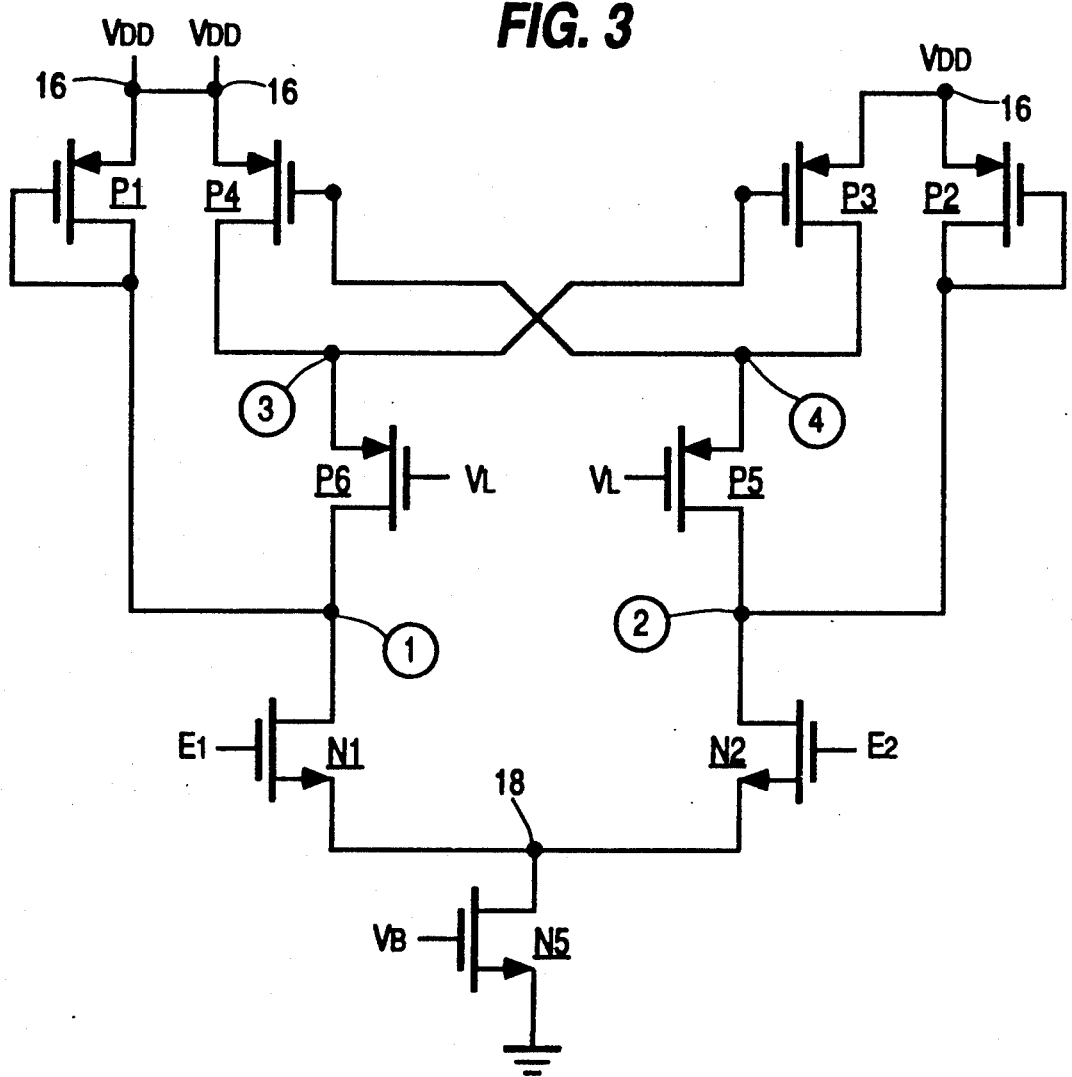
FIG. 3 is a simplified schematic diagram of the circuit of FIG. 1 during data acquisition phase.

When VL is low, P5 and P6 are turned-on and function as transmission gates. P6 couples output O1 of differential stage 12 to input node 3 of the latch and P5 couples output O2 of differential stage 12 to input node 4 of the latch. Concurrently, when VL is low, transistor N6 is turned-off and transistor P7 is turned-on. Turning-off N6 removes the connection between node 5 and ground and turning-on P7 applies $V_{DD}$ to terminal 5 which renders flip-flop 14 inoperative. However, as detailed below, part of flip-flop 14 functions as part of the load for differential stage 12. To more clearly illustrate this point, the active components of the circuit of FIG. 2 during a data acquisition phase are shown in FIG. 3. [Note that when $V_L$ is low, the potential difference between the gate and source of N3 and N4 is very small and N3 and N4 serve no function. The resultant circuit may therefore be simplified as shown in FIG. 3.]

As shown in FIG. 3, the load connected to the drain of N1 includes the conduction path of P1 in parallel with the series combination of the conduction paths of P4 and P6 and the load connected to the drain of N2 includes the conduction path of P2 in parallel with the series combination of the conduction paths of P5 and P3.

It is evident from FIG. 3 that cross coupled transistors P3 and P4 (coupled via P6 and P5, respectively) of the flip-flop are common to amplifying stage 12 and to latching stage 14. This is an important feature of the invention. The operation of the circuit during data acquisition is as follows:

In response to differential input signals E1 and E2, differential input transistors (N1, N2) with their sources connected in common and fed by a constant current via N5 provide differential output signals at outputs O1 and O2. The drains of N1 and N2 are connected to load transistors P1 and P2 connected in a "diode-like" configuration and via transmission gates P6 and P5 to transistors P4 and P3 which are cross coupled. P5 and P6 are turned-on hard during the acquisition phase and function as transmission gates. P5 and P6 provide some isolation for P3 and P4 and may be sized differently than P3 and P4 to enable the voltages at nodes 3 and 4 to have greater amplitude variations. During the acquisition phase, P3 and P4 function to increase the gain of the input stage by the manner in which they modify the effective load impedance presented to N1 and N2. Because P3 and P4 are cross coupled they provide positive feedback. This positive feedback is moderated by the shunting effect of P1 and P2 which limit the voltage gain of P4 shunted by P1 (or P3 shunted by P2) to a value close to unity. The cross coupled pair presents a negative resistance which parallels and cancels most of the positive resistance of P1 and P2. As a result, the impedance presented to N1 or N2 is a rather high value.

The difference in the input signals (E1-E2) applied to the differential input pair is thus amplified and results in a larger differential voltage at output nodes 3 and 4. This amplified voltage then acts as pre-charge voltage and causes the regenerative latch 14 to assume the correct state during a subsequent latching phase. Clearly, during the data acquisition phase nodes 3 and 4 are precharged and store an amplified signal. Subsequently, when the latching signal ($V_L$) goes "high" turning-off P5 and P6 and enabling latch 14, 'and P4 are already fully primed and nodes 3 and 4 remain pre-charged to drive N3 and N4 to the appropriate condition. Also, as discussed below, as soon as the latch is enabled its components are configured to provide regenerative feedback which quickly drives the latch to the desired state.

In brief, during the data acquisition phase, when VL is low, either one of the two following conditions may be produced: A—for E1 greater than E2, the current through P1 is greater than the current through P2; the voltage (V1) at output O1 is less than the voltage (V2) at output O2; Likewise, the voltage (V3) at node 3 is less than the voltage (V4) at node 4; or B—for E1 less than E2, the current through N1 is less than the current through N2. As a result, V1 is more positive than V2 and V3 is more positive than V4. Since V3, which is applied to the gate of P3, is more positive than V4, which is applied to gate of P4, P3 will conduct less than P4, ensuring that V3 is more positive than V4 due to the cross-coupling of P3 and P4. Thus, the differential signals V1 and V2, produced in response to E1 and E2, are coupled to nodes 3 and 4 respectively for the condition when $V_L$ is low.

Referring to FIG. 2, at the onset of the latching or data storage phase, $V_L$ is switched from low to high, P5, P6 and P7 are turned-off and N6 is turned-on. Turning-off P5 and P6 decouples nodes 1 and 2 from nodes 3 and 4. However, as noted above, prior to the decoupling, the amplified signals at nodes 1 and 2 were coupled to nodes 3 and 4 and due to the cross coupling of P3 and P4 and parasitic nodal capacitance, the signals are stored and/or maintained at these nodes. When N6 is turned on (with P7 turned off) the voltage at node 5 is driven towards ground potential via the conduction path of N6. During the interval when node 5 is driven from VDD towards ground transistor, N3 and N4 function to some extent as if they were differentially connected.

However, with node 5 driven to ground, the dominant mode of operation is that P3 and N3 function as a first complimentary inverter which is cross coupled with P4 and N4 functioning as a second complimentary inverter. As the operating voltage across P3, N3 and P4, N4 goes from a value of zero (or close to zero) volts to a value of VDD (or close to VDD) volts the two inverters go through a high gain region. As the inverters go through the high gain region, the complementary transistors reenforce the regenerative feedback which forces one of nodes 3 and 4 to be driven to, or close to, VDD and the other one of nodes 3 and 4 to be driven to, or close to, ground potential.

To complete the description of the operation of the circuit, recall that for E1 greater than E2, V1 is less than V2 and V3 is less than V4. When VL goes high, the fact that V4 is more positive than V3, causes P3 to conduct less than P4 and N3 to conduct more than N4. Hence, node 3 will be driven more negative than node 4. The voltage at node 3 is applied to the gates of P3 and N3. Since the voltage V3 at node 3 is more negative than the voltage V4 at node 4, P3 will be driven into greater conductivity and N3 into lower conductivity. This causes P4 to conduct less and N4 to conduct more, causing V3 to be driven further towards ground. The process continues until P3 is fully on and N3 is fully off and N4 is fully on and P4 is fully off. Thus, at the end, node 3 is at, or close to, ground or logic "0" (in phase with E2) and node 4 is at, or close to, VDD (or "high") or logic "1" (in phase with E1). N3, P3, N4 and P4 form a standard latch and will store the information without power dissipation (except for leakage) until VL is driven low and new signals get coupled to nodes 3 and 4.

The operation of the circuit for E1 less than E2 is similar to that described above, except that node 3 gets driven "high" and node 4 gets driven "low". Clearly, using a "complementary" latch of the type shown in the figures ensures that once equilibrium is reached, no significant current is drawn by the latch.

It has thus been shown that signals applied to the inputs 20, 22 of the comparator (N1,N2,P1,P2,N5) can be coupled via P5, P6 to inputs nodes of a selectively powered bistable latch, which when powered will transform the small differential signals into much larger voltage levels representing logic "0" and logic "1" levels and which can then store the signals.

Referring to FIG. 2, note that each one of the transistors is shown with two drain lines to indicate that the transistors are formed with an extended drain region to enable operation at higher operating voltages.

What is claimed is:

1. The combination comprising:
   a deferential amplifier stage having first and second inputs for the application thereto of first and second input signals respectively and having first and second differential outputs at which are produced first and second output signals corresponding to the relative values of the first and second input signals;
   a selectively enabled complementary flip-flop having first and second inputs, said flip-flop, when enabled, being settable to either one of two states corresponding to the signals applied to said first and second inputs;
   first and second selectively enabled transmission gates, said first transmission gate being coupled between said first differential output and one of said first and second inputs of said flip-flop and said second transmission gate being coupled between said second differential output and the other one of said first and second inputs of said flip-flop; and
   a single clock signal coupled to said flip-flop and to said first and second selectively enabled transmission gates for, during one time period, enabling said transmission gates and concurrently disabling said flip-flop and for, during a subsequent time period, disabling said transmission gates and concurrently enabling said flip-flop.

2. The combination as claimed in claim 1, wherein said differential amplifier stage includes first and second differentially connected transistors having their drains respectively connected to said first and second differential outputs;

wherein the conduction paths of said first and second transmission gates are respectively connected between said first and second differential outputs and said inputs of said flip-flop; and wherein said flip-flop includes at least two cross coupled transistors which are coupled to said differential outputs via said transmission gates during said one time period.

3. The combination as claimed in claim 1, wherein said first transmission gate includes a first gating transistor of first conductivity type and said second transmission gate includes a second gating transistor of said first conductivity type; each one of said first and second gating transistors having a conduction path and a control electrode wherein the conduction path of aid first gating transistor is connected between said first differential output and said first input of said flip-flop and wherein the conduction path of said second gating transistor is connected between said second differential output and said second input of said flip-flop; and wherein said single clock signal is applied to the control electrodes of said first and second gating transistors.

4. The combination as claimed in claim 3, wherein said selectively enabled flip-flop includes first and second cross coupled transistors of first conductivity type and third and fourth cross coupled transistors of second conductivity type, each one of said first, second, third and fourth cross coupled transistors having a conduction path and a control electrode; wherein the conduction path of said first cross coupled transistor is connected between a first power terminal and said first input of said flip-flop; wherein the conduction path of said second cross coupled transistor is connected between said first power terminal and said second input of said flip-flop; wherein the conduction path of the third cross coupled transistor is connected between said first input of said flip-flop and an intermediate node; wherein the conduction path of the fourth cross coupled transistor is connected between said second input of said flip-flop and said intermediate node; wherein the control electrodes of the first and third cross coupled transistors are connected to said second input of said flip-flop; wherein the control electrodes of the second and fourth cross coupled transistors are connected to said first input of said flip-flop; and said flip-flop including a fifth transistor of said second conductivity type having a conduction path and a control electrode; wherein the conduction path of said fifth transistor is connected between said intermediate node and a second power terminal for selectively enabling said flip-flop; and wherein the control electrode of said fifth transistor is connected to the control electrodes of said first and second gating transistors.

5. The combination as claimed in claim 4, wherein said selectively enabled flip-flop includes a sixth transistor, said sixth transistor having its conduction path connected between said first power terminal and said intermediate node; and wherein said sixth transistor is enabled when said fifth transistor is disabled for providing a reverse bias to said third and fourth cross coupled transistors and said sixth transistor is disabled when said fifth transistor is enabled.

6. A latching comparator comprising:

a plurality of transistors, each transistor having first and second electrodes defining the ends of a conduction path and a control electrode;

first and second of said plurality of transistors being differentially connected; said first transistor having its conduction path connected between a first output node and a first common node and said second transistor having its conduction path connected between a second output node and said first common node;

means for applying input signals to be compared to said control electrodes of said first and second transistors;

a selectively enabled bistable storage circuit having first and second input/output (I/O) terminals, first and second power terminals for the application therebetween of an operating potential and an intermediate node; said bistable storage circuit including a third, a fourth, a fifth and a sixth transistor of said plurality of transistors; said fifth and sixth transistors being of first conductivity type and said third and fourth transistors being of second conductivity type; said third and fourth transistors forming a first cross coupled pair of transistors and said fifth and sixth transistors forming a second cross coupled pair of transistors; said third transistor having its conduction path connected between said first power terminal and said first I/O terminal; said fourth transistor having its conduction path connected between said first power terminal and said second I/O terminal; said fifth transistor having its conduction path connected between said intermediate node and said first I/O terminal; said sixth transistor having its conduction path connected between said intermediate node and said second I/O terminal; the control electrodes of said third and fifth transistors being connected to said second I/O terminal and the control electrodes of said fourth and sixth transistors being connected to said second I/O terminal;

said bistable storage circuit including a seventh transistor of said first conductivity type having its conduction path connected between said intermediate node and said second power terminal;

an eighth one of said plurality of transistors having its conduction path connected between said first output node and said first I/O terminal;

a ninth one of said plurality of transistors having its conduction path connected between said second output node and said second I/O terminal; and means coupled to said seventh, eighth and ninth transistors for selectively disabling said seventh transistor and enabling said eighth and ninth transistors during one time interval, and for selectively disabling said eighth and ninth and tenth transistors and enabling said seventh transistor during a second time interval.

7. The latching comparator as claimed in claim 6, wherein said means coupled to said seventh, eighth and ninth transistors includes means for applying the same clocking signal to the control electrodes of said seventh, eighth and ninth transistors.

8. The latching comparator as claimed in claim 6, further including a tenth transistor having its conduction path connected between said first power terminal and said intermediate node and means coupled to the control electrode of said tenth transistor for turning-it-off when the ninth transistor is enabled.

9. The latching comparator as claimed in claim 6 further including a first load means connected between said first output node and said first power terminal and a second load means connected between said second output node and said first power terminal.

10. The combination comprising:
a differential amplifier stage having first and second inputs for the application thereto of first and second input signals respectively and having first and second differential outputs at which are produced first and second output signals corresponding to the relative values of the first and second input signals;
a selectively enabled complementary flip-flop having first and second inputs, said flip-flop, when enabled, being settable to either one of two states corresponding to the signals applied to said first and second inputs, said flip-flop including first and second cross-coupled transistors; each transistor having a conduction path and a control electrode; said first transistor having its conduction path directly connected between a first power terminal and the first input of said flip-flop, said second transistor having its conduction path directly connected between said first power terminal and the second input of said flip-flop and the control electrode of said first transistor being connected to the second input of the flip-flop and the control electrode of the second transistor being connected to the first input of the flip-flop, said first and second transistors being permanently connected in circuit between said first power terminal and said first and second inputs of said flip-flop to provide regenerative feedback;
first and second selectively enabled transmission gates, said first transmission gate being coupled between said first differential output and one of said first and second inputs of said flip-flop and said second transmission gate being coupled between said second differential output and the other one of said first and second inputs of said flip-flop; and
means coupled to said flip-flop and to said first and second selectively enabled transmission gates for, during one time period, enabling said transmission gates and concurrently disabling said flip-flop and for, during a subsequent time period, disabling said transmission gates and concurrently enabling said flip-flop.

* * * * *